United States Patent [19]

Grot

[11] 4,450,889
[45] May 29, 1984

[54] MOLD HAVING A HELIX FOR CASTING SINGLE CRYSTAL ARTICLES

[75] Inventor: Arnold S. Grot, Glastonbury, Conn.

[73] Assignee: United Technologies Corporation, Hartford, Conn.

[21] Appl. No.: 409,785

[22] Filed: Aug. 20, 1982

[51] Int. Cl.³ .............................................. B22C 9/04
[52] U.S. Cl. .................................. 164/361; 164/122.2; 164/125
[58] Field of Search ................. 164/23, 24, 34, 122.1, 164/122.2, 125, 128, 361

[56] References Cited

U.S. PATENT DOCUMENTS

| | | | |
|---|---|---|---|
| 3,537,949 | 11/1970 | Brown | 164/24 |
| 3,712,368 | 1/1973 | Phipps | 164/361 |
| 4,111,252 | 9/1978 | Day et al. | 164/23 |
| 4,133,368 | 1/1979 | Hayes | 164/35 |
| 4,180,119 | 12/1979 | Burd et al. | 164/34 |

FOREIGN PATENT DOCUMENTS 0034021 8/1981 European Pat. Off. ......... 164/122.2
2100633 1/1983 United Kingdom ............ 164/122.2

Primary Examiner—Gus T. Hampilos
Assistant Examiner—Richard K. Seidel
Attorney, Agent, or Firm—C. G. Nessler

[57] ABSTRACT

A ceramic shell mold for directional solidification of a single crystal metal article has an improved starter section which converts columnar grain growth to single crystal grain growth. The pitch or lead of the helix is chosen so that the separation between adjacent turns of the helix is less than twice the thickness of the layered ceramic shell material which comprises the mold. Thus, when the ceramic shell mold is formed by the repetitive application of layers of ceramic to a wax pattern, the gap between adjacent turns of the helix will be bridged when the mold has reached 50-80% of its final thickness. Then, continued accumulation of ceramic layers bridges the turns of the helix thereby giving it strength. A helical passage diameter in the 8-10 mm range significantly increases single crystal casting yields compared to smaller diameters commonly used heretofore.

5 Claims, 4 Drawing Figures

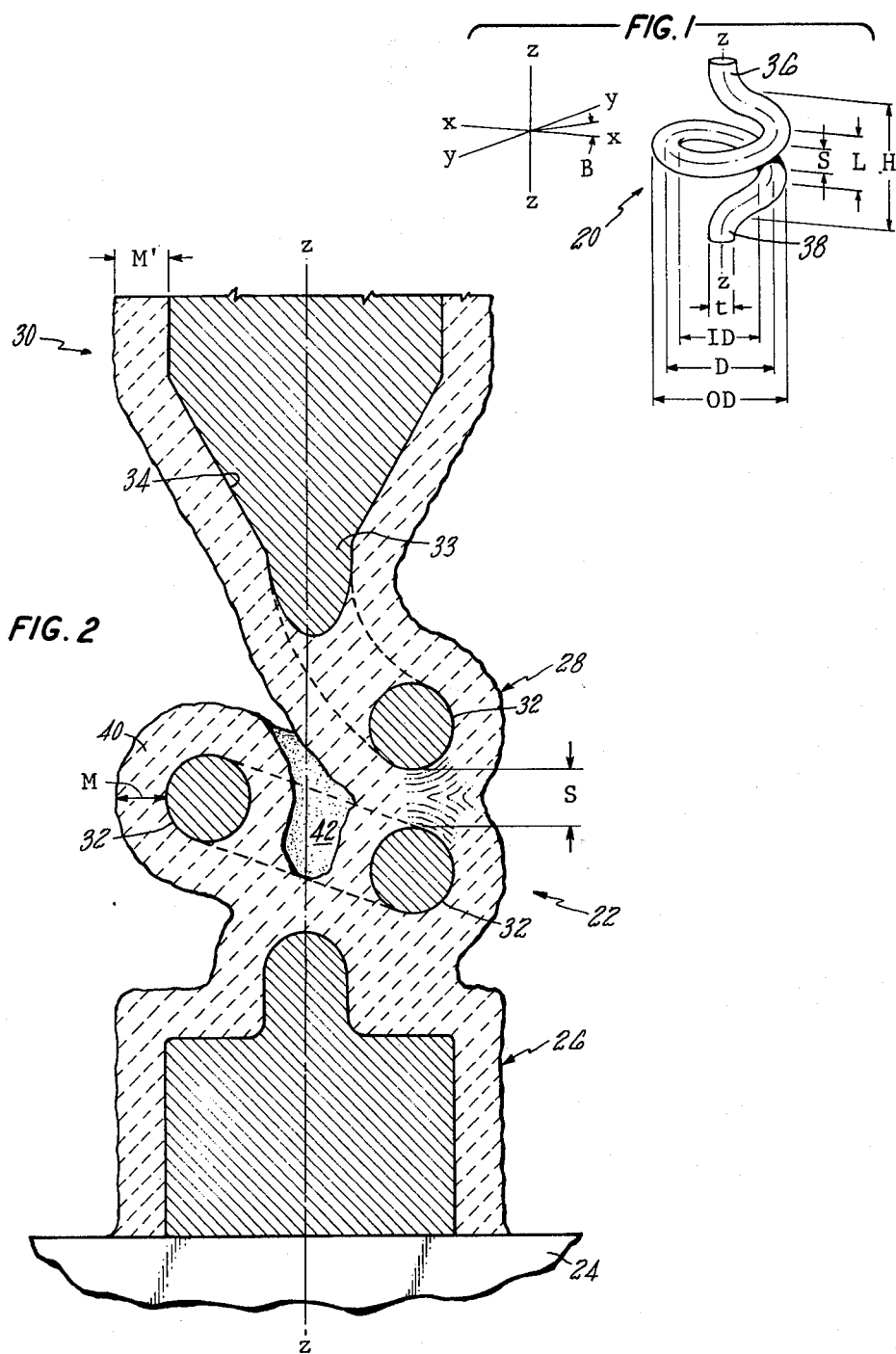

MOLD HAVING A HELIX FOR CASTING SINGLE CRYSTAL ARTICLES

DESCRIPTION

1. Technical Field

The present invention relates to the field of casting, more particularly to the directional solidification of single crystal metal articles.

2. Background

In the directional solidification process for casting metals, controlled cooling is used to cause a solidification interface to move progressively through a ceramic mold filled with molten metal. Single crystal articles, those having but a single grain, may be cast in the highest technology embodiment of this process. The present state of the technology of single crystal casting is that discoveries and refinements are still being made; but the new discoveries are much more subtle than the discoveries made in the past. They are nonetheless significant, in that the economics of casting are importantly determined by the ease with which good single crystal castings are made.

While there are variations in the manner by which single crystal castings can be formed, in all of them a solidification interface, or front, having the desired crystal structure must be created within the molten metal of the casting. One approach to doing this is to cause the interface to move through very small and confined points of the mold, such as shown in U.S. Pat. No. 1,793,672 to Bridgman and U.S. Pat. No. 4,015,657 to Petrov, to cause a single grain, or crystal, to predominate. Another method which is somewhat more efficient in requiring less vertical height of the mold, is revealed in U.S. Pat. Nos. 3,494,709 and 3,536,121 to Piearcey. The solidification interface is caused to pass through a zig-zag passage in the mold; the resultant change in direction causes rapid selection of a single grain from a multiplicity of columnar grains which were initiated at a heat sink. In a refinement of the foregoing, a helix shape is used, as shown in U.S. Pat. No. 3,625,275 l to Copley et al. A helical tube is used to cause single crystal growth within a casting.

Generally, the phenomena which result in a single crystal when a solidification interface is caused to move through a helix are described in U.S. Pat. No. 3,524,636 to Copley et al. and pending application Ser. No. 343,084 filed Jan. 27, 1982 by Giamei et al. and having common assignee herewith. In the U.S. Pat. No. 3,524,636 and elsewhere, it is taught that the helix section and even the entire article section of the mold should be surrounded by a second ceramic shell structure, with the space between being filled with molten metal. This, the so-called "cocoon" configuration, was used to improve thermal gradients and avoid extraneous nucleation in the helix, leading to crystallographic defects in the casting. At the present time careful furnace conditions and mold design are used to minimize crystal defects. As far as helix shapes are concerned, they have tended to be narrow passages, since passages have been conceived as being advantageous, in accord with other work mentioned above. The shapes shown in the below-mentioned patents to Hayes, Day et al., and Burd et al. are representative of the geometries of current art helixes.

Generally, helix-containing molds have been made by the well-known "lost wax" process. Layers of ceramic material are deposited on a wax pattern, which is subsequently removed. Prior to casting, the hollow ceramic shell mold is mounted on a cold metal chill plate, as shown in the references above. The mold configuration is such that nearest the chill plate is a cavity adapted to receive molten metal and to promote the initiation of directional solidification, as columnar grain growth. Immediately above the cavity is the helical selector section which converts the columnar grain growth into single crystal growth. Above the helical section is the article cavity with its associated gating. Thus, the entire weight of the article portion of the mold is supported on the relatively fragile helix which connects it to the starter section. When the mold is filled with molten metal, this weight can be considerable and fracture of the helix before and during casting have occurred. Therefore, various techniques have been used to avoid the fracture problem.

U.S. Pat. No. 4,133,368 to Hayes indicates one solution, wherein the helix section is preformed of a strong monolithic ceramic material which is then incorporated into the mold. U.S. Pat. No. 4,111,252 to Day et al. shows a mold similar to Hayes, wherein the helix passage region is completely filled in with ceramic mold material. The disadvantages of these approaches is in the cost of a preform, the mechanical aspects of including a preform within the mold properly and the adverse heat transfer effects of the heavy ceramic surrounding the helix passage.

Another solution has been to provide structural support to the mold, independent of the helical section. For example, vertical struts are run from the chill plate up to portions of the article cavity to share part of the load and give the mold stability with respect to any bending moments which might be imposed on the helical section. This approach is effective, but necessitates additional work in manufacturing of the molds. In addition, if the struts are placed improperly, they can upset the desired thermal gradients which lead to good directional solidification.

Another solution, mentioned above, has been to purposely form a small cocoon around the helix so that there is a structural ceramic cylinder surrounding the helix section. This also is effective, but it necessitates significant additional work in fabrication of the mold. Still another solution is that shown in U.S. Pat. No. 4,180,119 to Burd et al wherein the wax of the helical part of the pattern is wrapped around a preformed monolithic ceramic rod. This approach has the essence of simplicity and it appears effective. But it does not involve the addition of a further element into the mold, as does the preform.

While single crystal castings have been effectively made using the foregoing techniques further improvement in simplicity and casting yield is still desired.

DISCLOSURE OF THE INVENTION

An object of the invention is to construct ceramic shell molds for the casting of single crystal articles, where the shell molds contain a starter section having a helical passage, where the mold is strong but at the same time easy to construct and configured to provide good casting yields.

According to the invention, a ceramic shell mold for directional solidification of a single crystal is comprised of a starter section, an article section and a selector section, connecting the starter section to the article section. The selector section has a helical shaped passage, with the pitch of the helix being such that the separation between adjacent turns is less than twice the thickness of the shell on the exterior of the passage. As an example of the invention, a wax pattern which defines the helix passage is coated repetitively with layers of ceramic until the layers on adjacent turns of the helix meet. Then, with continued accretion of ceramic layers, the subsequent layers will form a bridging ceramic shell along the entire outside diameter of the helix, thereby giving it strength. Preferably, the gap between adjacent turns will be bridged when the ceramic shell mold has reached about 50-80% of its final thickness, as measured at a reference thickness point. A typical shell mold will have a thickness of about 6-8 mm after the wax is melted out and it is fired and ready for casting.

Also in the invention the helical passage diameter is 8 mm or greater, preferably 9-10 mm, while the inside diameter of the helix is 5 mm or greater, preferably 9.5-16 mm. The lead angle in degrees is 5-35; preferably 12-16. Within such parameters, with a helix of at least one turn diameter, it is found that the structural features of the carefully bridged helix passage can be readily realized.

There is an interrelation between the passage diameter and the bridging. Generally, bridging decreases the lateral heat transfer from the helix shaped selector section. Thus if helix passageways of 5-7 mm known in the prior art are bridged lower casting yields result. But with the increased cross sectional area and heat conductive path of an 8 mm or larger passage, casting yields are in fact increased and mold cracking is reduced.

DESCRIPTION OF THE DRAWINGS

FIG. 1 shows a helix shaped article shaped as would be the wax pattern used in the manufacture of a mold having a selector section with a helical passageway.

FIG. 2 is a vertical cross section through a metal filled ceramic mold resting on a chill plate and particularly shows details of the selector section.

BEST MODE FOR CARRYING OUT THE INVENTION

Figure 3:
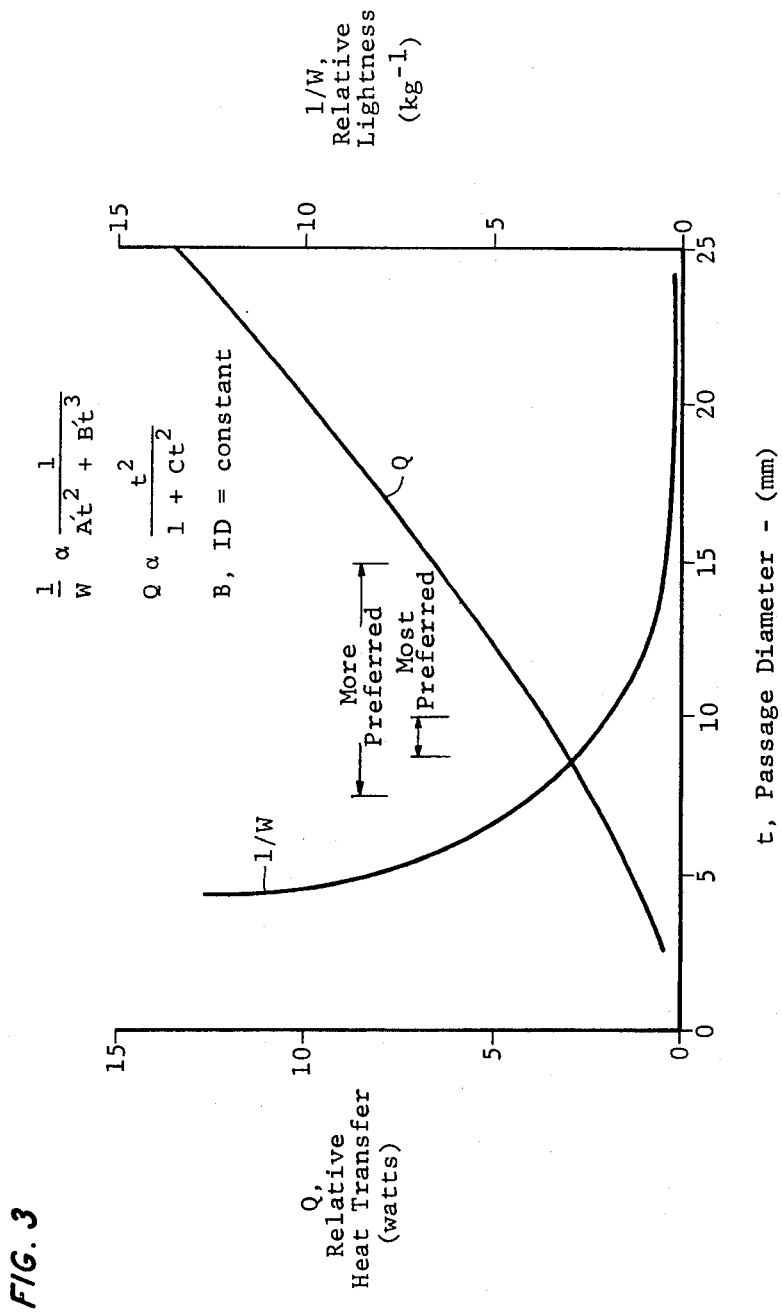
FIG. 3 is a graph showing the relative change in heat transfer along a helix made of metal, compared to the relative change in lightness (inverse of weight) of the metal helix.

The present invention is particularly useful with ceramic shell molds. These are ceramic molds which are created by accumulating layers of ceramic material on the surface of a fugitive wax investment casting pattern. U.S. Pat. No. 2,961,751 to Operhall et al is typical in describing the steps in the manufacture of such molds and the teachings thereof are hereby incorporated by reference. Shell molds are well known and used in the investment casting of superalloys, especially in the making of precision parts such as gas turbine airfoils. Preferred molds are made of predominantly zircon particulate; although predominantly alumina molds are often preferred for their higher temperature capability. There are many various techniques for constructing shell molds, and in the present invention the term shell mold means any mold made by processes which involve the accretion of successive layers of ceramic material. The mold described is one useful for casting a nickel superalloy part using directional solidification, as described in the patents mentioned in the background and elsewhere, including U.S. Pat. No. 4,190,094 to Giamei.

FIG. 1 shows a helical shaped object 20 having about 1.5 turns, lying along a z axis. FIG. 2 shows a vertical cross section through the lower parts of a ceramic mold 22 resting on a chill plate 24. The mold is shown filled with solidified metal, more or less as it would appear just after a solidification interface had moved through the mold, vertically upward from the chill plate. The mold has three portions: a starter section 26, a selector section 28 and an article section 30, all connected together. The selector section has a helical shaped passageway 32 filled with metal having the shape of the object shown in FIG. 1.

In the use of the mold, molten metal is poured into the mold and fills it. Since the chill plate 24 is cold, the metal in the starter section 26 first freezes with a polycrystalline columnar structure. With subsequent controlled cooling of the mold, a solidification interface is caused to move vertically along the vertical mold Z axis and in so doing it passes upwardly through the helical passage 32 and then into the entrance 33 of the article section of the mold. As shown in FIG. 2, the bottom of the article section 30 usually has a transition portion 34 which allows the solidification interface to expand from the relatively narrow passageway of the selector section into the wider cavity which comprises the inside of the article section 30 of the mold.

In the present invention, there is a criticality in the configuration of the helix passageway. FIG. 1 illustrates in large part the terminology which is used herein to define the invention. The Figure shows the shape of an article 20 such as the wax pattern which is used to form the internal passageway in the selector section. It analogously shows the metal article which will be solidified in the passageway after casting. The helix article 20 usually has an upper end 36 and lower end 38 which are straight passages, lying along the vertical z axis of the helix. These are not essential parts of the helix passageway but are appurtenances which make it easier for the solidification interface to enter and leave without the creation of crystallographic casting defects. The terminology used for the helix article itself is similar to that used for helical springs. The helix article has a height h and a mean diameter D. As measured in a plane normal to the z axis, the helix article has an inside diameter ID and an outside diameter OD. The pitch (or lead) L of the helix is the center line distance between adjacent turns. The helix is characterized by a lead angle B; this is the angle which the development (unrolling of the helical curve onto a plane surface) makes with the x-y plane perpendicular to the z axis. The helical passageway has a circular cross section of diameter t. Referring to both FIGS. 1 and 2, it is seen that adjacent turns of the passageway 32 are spaced apart a distance S. From FIG. 1, it will be understood that $S+t=L$. As described in more detail below, in the invention the distance S is related to the thickness M of the ceramic shell mold which surrounds the helical passage 32.

As indicated in the Background the function of the helix passageway was heretofore primarily conceived to be that of physically causing the solidification interface to convert from a columnar grain structure to a single crystal structure. Also, conceptually the passage was made of a relatively small diameter, since small restrictions were independently known to be helpful.

The function of the chill plate is to cool the starter section and thus initiate solidification. Once initial solidification takes place the interface moves an indefinite distance vertically toward the helix until the heat input (from the furnace) to the mold balances the heat extraction through the chill plate. To thereafter move the interface vertically upward through the selector, use has been made of controlled cooling of the furnace. More preferably, progressive downward withdrawal of the mold from the furnace is used. See U.S. Pat. Nos. 3,700,023 to Giamei et al and 3,714,977 to Terklesen, both of the present assignee. It was heretofore appreciated that there would be some heat transfer along the solidifying helical passage and through the starter section to the chill plate and also heat transfer radially outward from the helix. But there was little or no appreciation of how significant these modes of heat transfer were. In the favored withdrawal method, the primary heat loss is by radiation from any point of the mold which is exposed to a colder zone. Given the distance which an article cavity may be from the chill plate, when the metal starts solidifying in the article section there would appear to be little essential contribution to heat extraction by conductance of heat through the long metal path to the chill plate. With the small size of helical passageway which was used heretofore, the heat flux through the helix was in fact not considered of great import with respect to solidification in the transition section and the article section. However, my experiments have shown now that improved castings will result if the heat transfer through and from the helix passageway is improved. I do this by increasing the helical passage diameter and minimizing the amount of ceramic around the helix.

Increasing the helix passage diameter has negative aspects. One is losing the known advantage of a narrow constriction which permits the least number of grains to propagate into the helical passage and increases the effectiveness of a helix of relatively short length. Another is the increased volume of the helix, since larger volumes will require a greater weight of metal to fill them. The metal in the starter and selector section is essentially lost since this portion of the casting is generally severed and discarded. When making relatively light-weight hollow articles such as gas turbine airfoils out of expensive superalloys, the cost of the discarded portion can be significant. From the prior art it is not known how much analysis might have been applied to sizing of the helix passageway, but before my invention the preferred passageway diameter was about 5-7 mm.

Based on experiments and calculations I have now concluded that a preferred passageway diameter is 7.5-25 mm, more preferably 7.5-15 mm, and most preferably 9-10 mm. Naturally if the helix passageway diameter t is increased, the helix diameter D must be also increased as must the lead L, when a certain minimum ID and S are maintained. As mentioned elsewhere in this discussion, it is necessary that such minimums be observed. Consequently, increasing the diameter of the helical passage means that the helix passageway weight W will go up according to the relationship $$W \alpha (A't^2 + B't^3)$$

where $A'$ and $B'$ are constants. The capability of a helial passage filled with solidified metal to conduct heat from the article section to the starter section or chill plate is a function of the cross sectional area of the helical passage and the length of the passage. It can be shown that Q, the heat transfer per unit time along the passageway is related to the passage diameter according to the relationship $$Q \alpha \left( \frac{t^2}{1 + Ct^2} \right)$$

where C is a constant. The derivations of the foregoing are set forth below. FIG. 3 is a plot utilizing the foregoing relationships. Q is shown as a function of passage diameter while "lightness", the reciprocal of passageway weight W, is also plotted as a function of passage diameter. In the figure arbitrary values are used for the constants; therefore, the exact intersection of the curves is not significant. The figure illustrates the fact that the capability for heat transfer Q rises substantially with passage diameter, while the relative lightness behaves inversely with a relationship more sensitive to t value. I have indicated on the figure the more preferred and most preferred ranges for passage diameter. These ranges were based on my actual experiments and calculations. They have not been calculated from data shown in the FIG. 3 because the value of the constants was not ascertained.

Specifically, I discovered greatly improved results when the helix diameter is made at least 8 mm in diameter, more preferably 8-15 mm and most preferably 9-10 mm, provided other parameters discussed below are also conformed with. With the larger diameter helix the following benefits accrue. First, the shell can be simply made with no special attention to the selector section and it will have substantially greater strength than a 7 mm or less helix diameter. Second, since increased shell thickness (compared to that of the rest of the mold) is not needed in the selector section, radially outward heat transfer is improved and less deviant crystal growth occurs in the selector. Third, improved heat transfer along the helical passageway results. The last two factors enable the production of single crystal castings with better crystal structure yields than are produced with a small helix with a heavy ceramic structure (such as in the Hayes and Day et al patents mentioned in the Background) and comparable in yield with the cocoon techniques.

In Table 1 are set forth the parameters which pertain to helix shaped passageways which I have discovered to offer improvement. Referring to the Table, the passage diameter t can be quite large, up to at least 25 mm. But as reference to FIG. 3 shows, the helix section weight increases greatly according to the relation previously set forth, inasmuch as the diameter D of the helix must also increase (to preserve a minimum ID).

TABLE 1

Dimensions of Helical Passageways in Mold Selector Sections

| | | Preferred | More Preferred | Most Preferred |
|---|---|---|---|---|
| t, | passage dia, mm | 8-25 | 8-15 | 9-10 |
| B, | lead angle, degrees | 5-35 | 10-20 | 12-16 |
| M, | ceramic shell thickness, mm | 2.5+ | 5-13 | 6.5-7.5 |
| ID, | helix passageway inside dia, mm | 6+ | 6.5-20 | 9.5-16 |
| N, | turns of helix | 1+ | 1-2 | 1.25-1.5 |

TABLE 1-continued

| | | Dimensions of Helical Passageways in Mold Selector Sections | | |
|---|---|---|---|---|
| | | Preferred | More Preferred | Most Preferred |
| S, | passageway passageway spacing as % of M | 60–180 | 100–160 | 120–140 |

Thus, there is a strong preference for the lower end of the range. There must be some significant upward slope of the passageway, as it is reflected in the lead angle. With greater diameter helix, a lesser lead angle is geometrically possible. However, since greater diameter helixes create a greater length of passageway, they are not preferred. Therefore, the more preferred angle is 10°–20°, while the most preferred angle is 12°–16°. Most preferably, the helical passageway has a small inside diameter ID of 9.5–16 mm. Smaller diameters can be used, down to 6 mm but they create practical problems in manufacture, and also there is a need for a certain minimum diameter in order to insure that there is sufficient ceramic layer thickness and strength on the inside diameter of the helical passage. Large inside diameters are undesired because they increase the mean diameter D of the helix and therefore the length of the passage without providing any commensurate benefit. Because of the other aspects of my invention which are discussed below, the helix should have at least one turn. Many turns may be used but of course they increase the passage length and this is disadvantageous. It is more preferred that the helix have less than two turns and most preferred is that the helix have 1.25–1.5 turns. The number of turns of the helix is related to the structural strength of the mold in the vicinity of the selector and it is for this reason that somewhat more than one turn is preferable. With 1.25–1.5 turns, there is a significant portion of the helix where in the vertical z axis direction there is overlap of one turn above the other. It is desirable for heat transfer reasons to minimize the distance H between one end of the passageway and the other. The distance H will be determined by the other parameters which I specify herein and in my preferred embodiment it will be about 40 mm.

The other important aspect of my invention is the spacing S between adjacent turns of the passageway, as illustrated in FIGS. 1 and 2. Heretofore, the lead L of a 7 mm diameter passage would be of the order of 21.5 mm which, coupled with a passageway diameter of 7 mm or less, means that the distance S was at least about 14–15 mm. The spacing between adjacent turns was relatively great compared to the thickness of ceramic shell which characterized the bulk of the mold. This can be seen in the figures of the aforementioned U.S. Pat. No. 4,111,252. I have now discovered that if the distance S is critically controlled, very strong helical passageways can be made using the conventional shell molding techniques. In a ceramic mold made by the techniques described above, about 8–9 layers are usually accumulated. In the best embodiment of my invention I have found that the distance S should be made small enough so that after about the fifth layer the space S is filled. Subsequent layers will thereafter form a continuous sheath around the outside diameter of the helix. When the adjacent turns are thus connected together, the helix is given additional strength.

Lesser and greater amounts of spacing can be used as illustrated by the data in Table 1. The passageway spacing S is best expressed as a percentage of M which is the shell thickness applied to the mold. Referring to FIG. 2, M' is the nominal thickness of the shell mold as it would be measured at the article section of the mold. Generally, the same number of layers will be accumulated over the entire mold although variations in thickness at different sections may be easily obtained by providing different amounts of layers to different portions of the mold. Therefore, while the thickness M in the vicinity of the selector section is generally the same as the thickness M' (taking into account possible variations caused by the extreme changes in surface contour of the article or helix) as a general rule the spacing S should be gaged according to the thickness of shell molds which is accumulated at a portion of the mold which is subjected to the same layer accumulation as in the vicinity of the passage spacing. In FIG. 2 the thickness M is taken to represent such a location. Another reference location could interchangeably be used if the ceramic shell making techniques did not make the thickness M representative. In the FIG. M is the thickness as it is measured along radius normal to the helical axis z, at the outermost diameter of a turn of the passage.

When the selector section is made in accord with my invention, the interior space 42 of the helix may or may not be filled with ceramic material, depending on the ID, the ceramic shell thickness M and the techniques of shell molding which are used. Bridging on the interior space corresponding to that on the exterior of the passageway will of course take place and this will aid selector section strength.

As indicated above, the ceramic material accumulating on adjacent turns of the passageway should join after about 60% of the shell material has accumulated. Thus, the distance S would comprise about 120% of the thickness M of the ceramic material which is finally accumulated, since the ceramic material is progressing from opposite sides of the space toward the center. If the distance S is too small, then this necessitates rather small and undesirable lead angles and a rather fragile ceramic structure between adjacent turns of the passageway. If S is too large, then the invention will not be carried out because the space between adjacent turns will not be filled in or bridged over with ceramic material having sufficient strength, during the normal formation of the ceramic shell. Accordingly, preferably the spacing S is 60–180% of M, and more preferably it is 100–160% and most preferably it is 120–140%. Thus the distance S will be more than one and less than two times the thickness M of the ceramic shell, in my more preferred embodiments.

Figure 4:
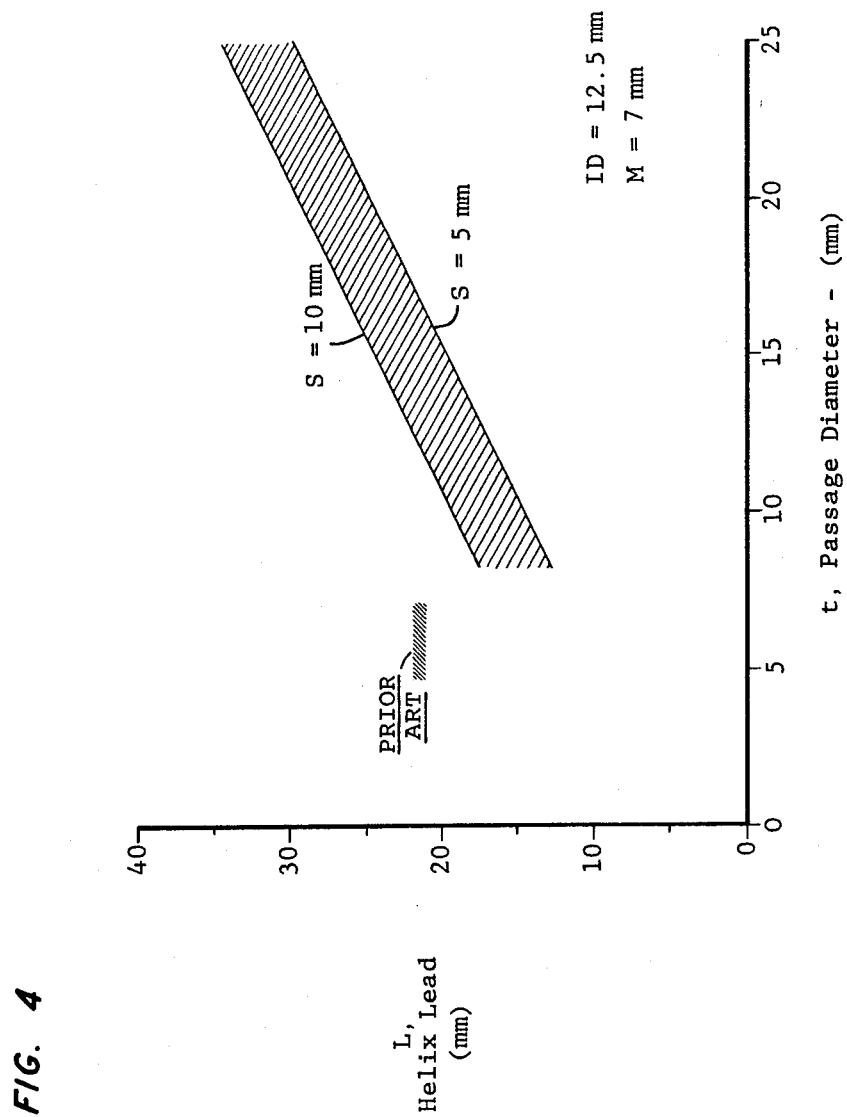
FIG. 4 is a graph showing how the lead of L (and thus the height of a full turn of a helix) increases with increasing passage diameter t when the practices of the invention are followed.

For commercial castings the shell mold thickness should be at least 2.5 mm, more preferably 5–13 mm and most preferably 6.5–7.5 mm. If the shell is too thin, then it does not have adequate structural strength while if it is too thick, it provides an undue barrier to heat transfer necessary in the directional solidification process. For the preferred ceramic shell thickness M of 6.5–7.5 mm, the spacing distance S (if 70–140% of M) will vary between about 4.5 and 10.5 mm. FIG. 4 shows therefore how the helix lead L must increase with increasing passage diameter to maintain the relationships set forth, when ID is held constant. As the lead increases with constant ID, the helical angle also increases, as indicated on the figure. Also, the height H will increase.

Since minimum height is desired, this means that passage diameters near 8 mm or so are desired.

In my invention the spacing S is critical and must be controlled as set forth. Therefore this will mean some of the other parameters will be dependent and may not be varied freely within the useful range. As an example, if the shell thickness M is 7 mm and the passage diameter t is 8 mm, then using a distance S of 12 mm (150% of M), the lead of the helix will be 20 mm. If the inside diameter ID is selected at 12.5 mm, then the diameter D will be 20.5 mm. This means that the lead angle will be 17.3°. If the lead angle was instead less than the useful or preferred range, then this would dictate change in S, t or ID to make it in compliance.

Upon consideration it will be appreciated that the turns of the helical passageway will be considerably closer to each other than in molds disclosed previous. Compare for instance the mold in U.S. Pat. No. 4,111,252 where the high lead angle, substantial lead, and small passage diameter mean that substantially more ceramic must be placed between adjacent turns than would accumulate in the making of the shell to a thickness characteristic of the other parts of the mold. Additional ceramic material must be specially packed between the adjacent helix turns when they are so widely spaced as shown.

More than 100 experimental molds and castings have been made to demonstrate the invention and data have verified its utility over the prior art as shown in Table 2. Production of sound crack-free molds is increased by about 3 percent. Casting yield is increased by about 14 percent. (Casting yield is generally a reflection of the freedom of a single crystal casting from deviant grain structures. Mold cracking during the casting process will often result in such deviations, in addition to poor heat transfer due to helix configuration.)

The simplest and most common embodiment of the invention will be that shown in the figures wherein the helical passage lies around a vertical z axis and wherein the starter and article sections of the mold are also lying along the z axis. However, as will be appreciated from consideration of other art, it is feasible to use a selector section with a helical passageway where the starter and article are not vertically aligned. For instance, see the U.S. Pat. No. 3,568,757 of Piearcey. In the foregoing description it was indicated that the helical passage had a circular cross section. Other cross sections may be used in the practice of the invention, although rounded cross sections are much preferred over those having sharp corners, such as rectangles and the like, because it is found that there is less extraneous nucleation and more structural strength in rounded cross section passageway.

TABLE 2

| Relative Single Crystal Casting Yields For A Nickel Base Alloy | | |
|---|---|---|
| | Relative Number Of Sound Molds | Relative Yield Of Defect Free Crystals |
| Cocoon around 7 mm dia helix with B = 20° and L = 21.4 mm | 1.00 | 1.00 |
| Plain helix of 9.5 mm dia with B = 13° and L = 17 mm | 1.03 | 1.14 |

APPENDIX

A. Derivation of Q, heat transfer along a helical passage having a passage dimeter t, a passage cross section area X, a helical inside diameter ID, a helical mean diameter D, and a constant lead angle.

S, the developed length of one turn of the helical passage is $$S \alpha \pi D / \cos B = \pi(ID+t)/\cos B = K_1 + K_2 t$$

where B is the helical lead angle and $K_1$ and $K_2$ are constants.

Thus, $$Q \alpha K X/S = K_3 t^2/K_1 + K_2 t = t^2/(1+Ct^2)$$

where k is thermal conductivity, and $K_3$ and C are constants.

B. Derivation of W, the weight of a helical passage having a constant inside diameter ID and other parameters as set forth in A above.

$$W = XS = K_4 t^2 (K_1 + K_2 t) = A' t^2 + B' t^3$$

Although this invention has been shown and described with respect to a preferred embodiment, it will be understood by those skilled in the art that various changes in form and detailed thereof may be made without departing from the spirit and scope of the claimed invention.

I claim:

1. A mold made of layered ceramic shell material, for containing molten metal during directional solidification of a single crystal article casting, wherein a solidification interface is caused to move progressively through the molten metal, comprised of
   (a) a starter section, for containing a portion of the molten metal in which a solidification interface is first initiated;
   (b) an article section, shaped to define the desired single crystal article; and
   (c) a selector section, connecting the starter section with the article section, for causing the solidification interface progressing from the starter section toward the article section to have the desired single crystal characteristic, the selector section containing a passage shaped as a helix having more than one turn, the helix lying along an axis and having a lead which provides a separation between adjacent turns of the passage that is more than one half but less than two times the thickness of the ceramic shell material defining the helix, as thickness is measured along the radius normal to the said axis at an outermost diameter of a turn of the passage, the layered ceramic shell material joining adjacent turns of the passageway at the outside diameter of the passageway.

2. The mold of claim 1 characterized by a helix having between 1-2 turns, a lead angle of 5-35 degrees, and a passage diameter of at least 8 mm.

3. The mold of claim 1 characterized by a helical lead of at least 13 mm and a ceramic shell material thickness of at least 7 mm.

4. The mold of claim 2 having a passage diameter of 8-15 mm, a lead angle of 10-20 degrees and a ceramic shell thickness of 5-13 mm.

5. The mold of claim 4 having a passage diameter of 9-10 mm, a pitch of 15-18 mm, a helical inside diameter of 9-16 mm, and a ceramic shell thickness of 6-8 mm.

* * * * *